United States Patent [19]

Saleh

[11] 4,345,169
[45] Aug. 17, 1982

[54] ZERO CROSSING DETECTOR

[75] Inventor: Mustafa Y. M. Saleh, Margate, Fla.

[73] Assignee: Siemens Corporation, Iselin, N.J.

[21] Appl. No.: 201,007

[22] Filed: Oct. 27, 1980

[51] Int. Cl.³ .................... H03K 5/153; G01R 19/175
[52] U.S. Cl. .................................... 307/354; 307/358; 328/150
[58] Field of Search ............... 307/252 UA, 354, 355, 307/356, 358; 328/150; 323/235, 299, 319

[56] References Cited
U.S. PATENT DOCUMENTS
3,768,024 10/1973 Letosky ............................... 307/354

Primary Examiner—John Zazworsky
Attorney, Agent, or Firm—Spellman, Joel & Pelton

[57] ABSTRACT

An improved zero crossing detector utilizes a voltage comparator having two inputs and an output. An amplifier supplies the electrical signal to one input and an inverting amplifier supplies the inverse of this signal to the other input of the voltage comparator. The voltage comparator changes its state when the relative polarities of its two inputs change.

3 Claims, 5 Drawing Figures

ZERO CROSSING DETECTOR

BACKGROUND OF THE INVENTION

The present invention relates to a device for detecting zero crossings of an electrical signal.

Zero crossing detectors are well known in the art and are used, for example, in synchronizing digital circuits to a sinusoidal reference signal. In a typical application, a sinusoidal signal produced by the power network or by an oscillator is converted into a square wave. It is important, in many cases, that the square wave shift from one logic level to the other precisely in time with the zero crossings of the sinusoidal signal.

In one particular application used in telephone networks, a sinusoidal signal is generated at an exchange to ring a subscriber telephone. It is desirable to connect this ringing signal to the subscriber telephone line when the ringing voltage is zero, so as to avoid an audible "click" at the telephone station, and to switch off the ringing signal at zero current so as to avoid a current surge through the switch. Thus, the ringing signal switch for each subscriber line must be synchronized with the positive-going and negative-going zero crossings of the ringing signal.

Conventionally, a zero crossing detector comprises essentially a threshold detector or "Schmitt trigger" which continuously compares the electrical signal with a reference voltage. This reference voltage is set at the DC level (for instance, zero volts) of the incremental electrical signal. The threshold detector produces a logical "one" when the electrical signal is above the threshold and a logical "zero" when the electrical signal is below the threshold. This type of threshold detector is adequate for most situations; however, inaccuracies in the voltage comparison and variations in the bias level of the signal result in inaccuracies in the zero crossing detection. Furthermore, since the threshold detector responds to change the logic level only after the voltage level of the zero cross (reference voltage level) has been crossed with a certain degree of tolerance, there is an inherent delay in the output of the zero crossing detector.

SUMMARY OF THE INVENTION

It is an object of the present invention to improve the accuracy of a zero crossing detector.

It is a further object of the present invention to increase the speed of a zero crossing detector.

The above noted objects, as well as other objects which will become apparent from the discussion that follows, are achieved, according to the present invention, by providing an input terminal for receiving the electrical signal, a voltage comparator having two inputs and an output and two amplifiers-namely, an inverting and a non-inverting amplifier-each respectively connecting the input terminal with one of the two inputs of the voltage comparator. Thus, instead of comparing the electrical signal with a reference voltage, it is compared with the inverse of itself. In this way, the difference between the signals on the two inputs of the voltage comparator will be equal, at all times, to twice the difference between the electrical signal and its bias level at the zero crossings. Thus, the zero crossing detector will be twice as sensitive as well as faster in actuation time than the conventional threshold detector which compares the electrical signal with a reference voltage.

Preferably, the inverting and non-inverting amplifiers in the threshold detector according to the invention have identical gain. This eliminates the requirement for accurate biasing of the inputs to the voltage comparator, and makes the zero crossing detector independent of the bias level of the incoming electrical signal.

The output polarity of the zero crossing detector may be easily changed by merely switching the inputs of the voltage comparator; that is, the signals received from the inverting amplifier and non-inverting amplifier, respectively. If desired, the zero crossing detector may be provided with a double-pole, double-throw switch to effect this change in polarity.

For a full understanding of the present invention, reference should now be made to the detailed description of the preferred embodiments and to the accompanying drawing.

DESCRIPTION OF THE PREFERRED EMBODIMENTS

The preferred embodiments of the present invention will now be described with reference to FIGS. 1-3 of the drawings.

Figure 1:
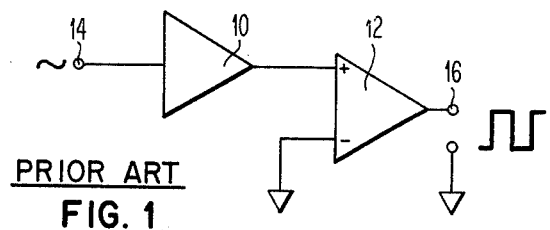
FIG. 1 is a schematic diagram of a conventional zero crossing detector.

FIG. 1 illustrates a conventional threshold detector comprising an amplifier 10 and a voltage comparator 12. An electrical signal, applied to the input terminal 14 of the circuit, is passed to the positive input of the voltage comparator. A reference voltage, such as a source of zero volts or ground, is applied to the negative input of the comparator. The voltage comparator is essentially a threshold device or "Schmitt trigger" which produces a logical "one" signal if the input signal to the positive terminal exceeds the input signal to the negative terminal and a logical "zero" if it does not. While this prior art zero crossing detector is adequate for many applications, it is apparent that the bias or zero level of the incremental electrical signal applied to the positive terminal of the voltage comparator 12 must be exactly equal to the reference voltage applied to the negative terminal for the circuit to work accurately. In addition, both the accuracy of the output and the circuit speed depend upon the accuracy and tolerance of the voltage comparator 12. In order to provide a definite output at input voltage signal levels exactly equal or close to the reference voltage, the voltage comparator is constructed to operate with a certain hysteresis; that is, the input signal must move past the reference voltage level in either direction by a certain value before the voltage comparator will change its logic state. This hysteresis, of course, results in an inaccuracy as well as a delay in the output response.

Figure 2:
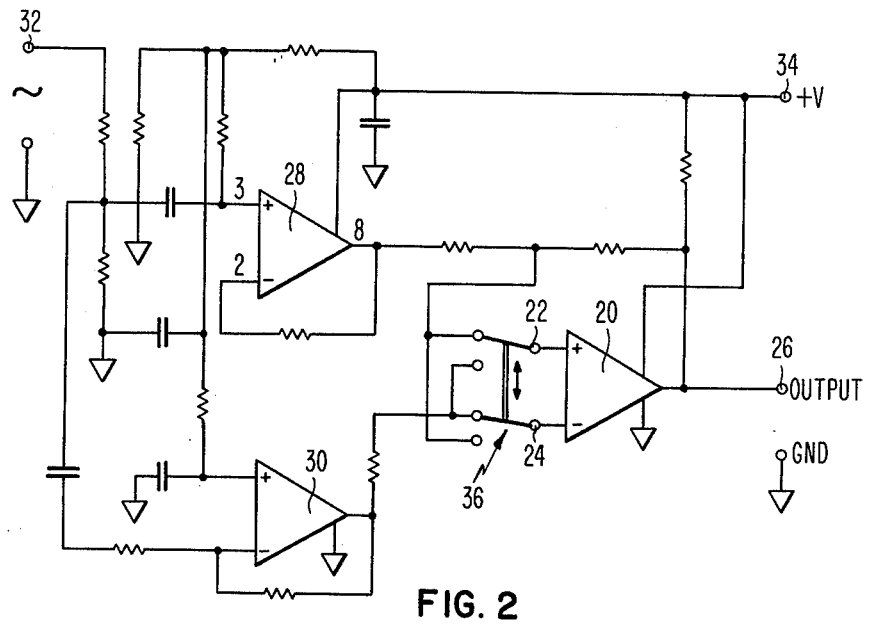
FIG. 2 is a schematic diagram of a zero crossing detector according to a preferred embodiment of the present invention.

FIG. 2 shows a preferred embodiment of the present invention. This circuit includes a voltage comparator 20 having two inputs 22 and 24 and an output 26. The inputs 22 and 24 are connected to receive signals from a non-inverting amplifier 28 and an inverting amplifier 30, respectively. Both the non-inverting amplifier and inverting amplifier receive a common input signal applied to the input terminal 32 of the circuit. Voltage bias for the circuit is provided by a resistor network supplied from a terminal 34 receiving a DC voltage.

The two amplifiers 28 and 30 preferably have identical gain. In practice, these amplifiers may be provided in the same integrated circuit, such as an LM358. The voltage comparator may be provided on the same or another integrated circuit, such as one-half of an LM392.

The outputs of the amplifiers 28 and 30 may be connected directly to the respective inputs of the amplifier 20, or may be connected thereto through a double-throw, double-pole switch 36. The switch is operative to interchange the connections of the amplifiers 28 and 30 to the inputs 22 and 24 of the voltage comparator 20. In this way, it is possible to quickly and easily reverse the output polarity of the voltage comparator with respect to the input signal applied to the input terminal 32.

Figure 3A:
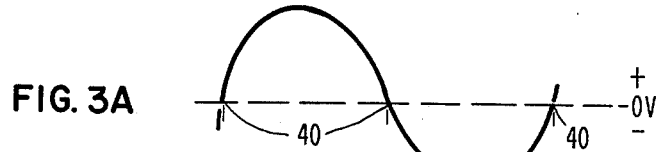
FIGS. 3A, 3B and 3C are signal diagrams illustrating the operation of the zero crossing detector of FIG. 2.
Figure 3B:
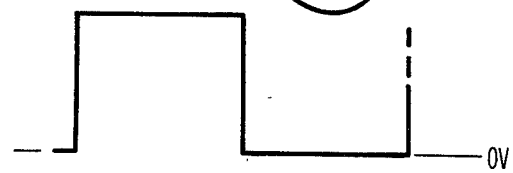
Figure 3C:
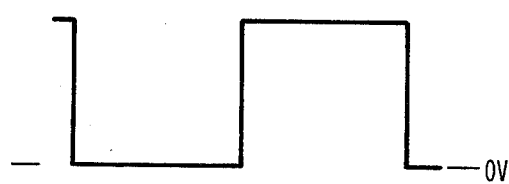

FIGS. 3A–3C illustrate the operation of the circuit of FIG. 2. A typical sinusoidal signal is illustrated in FIG. 3A. This signal has excursions about a bias level of zero volts. The purpose of the device of FIG. 2 is to detect the zero crossings 40.

The output signal from the voltage comparator is illustrated in FIGS. 3B and 3C. If the switch 36 is moved into the position shown in FIG. 2, the output signal will be as shown in FIG. 3B. If the switch 36 is moved into the opposite position so that the non-inverting amplifier 28 is connected to the input terminal 24 and the inverting amplifier 30 is connected to the input terminal 22, the signal at the output terminal 26 will be as shown in FIG. 3C.

Because the input signal is exactly sinusoidal, the output signal is a square wave; however, it will be understood that a non-sinusoidal input signal will produce rectangular pulses at the output, but not a square wave.

It will also be understood that the input signal may have a positive or negative bias level. Since the amplifiers 28 and 30 amplify only the incremental signal, zero crossings will be detected with respect to this bias level.

There has thus been shown and described a novel zero crossing detector which fulfills all the objects and advantages sought therefore. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. Apparatus for detecting zero crossings of an electrical signal, said apparatus comprising, in combination:
    (a) an input terminal for receiving the electrical signal;
    (b) a voltage comparator having two inputs and an output;
    (c) an inverting amplifier having an input and an output, said input thereof being coupled to said input terminal and said output thereof being coupled to one input of said voltage comparator; and
    (d) a non-inverting amplifier having an input and an output, said input thereof being coupled to said input terminal and said output thereof being coupled to the other input of said voltage comparator.

2. The apparatus recited in claim 1, wherein said inverting and non-inverting amplifiers have identical gain.

3. The apparatus defined in claim 1, further comprising switch means, connected between the outputs of said inverting and non-inverting amplifiers and the two inputs of said voltage comparator, for switching between a first connection in which the outputs are each connected to one of the inputs and a second connection in which the outputs are each connected to the other of the inputs, thereby to switch the polarity of the output of said voltage comparator.

* * * * *